United States Patent [19]

Baron et al.

[11] 4,100,037

[45] Jul. 11, 1978

[54] METHOD OF DEPOSITING A METAL ON A SURFACE

[75] Inventors: William James Baron, Franklin Township, Somerset County; John Thomas Kenney, Lawrence Township, Mercer County, both of N.J.

[73] Assignee: Western Electric Company, Inc., New York, N.Y.

[21] Appl. No.: 664,610

[22] Filed: Mar. 8, 1976

[51] Int. Cl.$^2$ .......................... C23C 3/02; C23B 5/64
[52] U.S. Cl. ....................... 204/15; 427/98; 427/304; 204/38 B
[58] Field of Search ............... 427/98, 304–306, 427/259; 106/1; 204/38 B, 20, 15

[56] References Cited

U.S. PATENT DOCUMENTS

| | | | |
|---|---|---|---|
| 2,441,960 | 5/1948 | Eisler | 427/304 |
| 3,011,920 | 12/1961 | Shipley | 427/304 |
| 3,532,518 | 10/1970 | D'Ottavio | 427/304 |
| 3,627,724 | 12/1971 | Lambert | 427/306 |
| 3,632,435 | 1/1972 | Eriksson | 427/306 |
| 3,640,765 | 2/1972 | DiStefano | 427/305 |
| 3,657,003 | 4/1972 | Klancy | 427/98 |
| 3,760,091 | 9/1973 | Cannizzaro et al. | 427/98 |
| 3,764,280 | 10/1972 | Lupinski | 427/306 |
| 3,775,117 | 11/1973 | Hoffman | 427/98 |
| 3,791,939 | 2/1974 | Ferrara | 427/98 |
| 3,793,072 | 2/1974 | Lando | 427/98 |
| 3,841,881 | 10/1974 | Feldstein | 106/1 |

OTHER PUBLICATIONS

Feldstein, Plating, Aug. 1970, pp. 1, 2.
Process Instructions, CuPosit Products, pg (PI54–55), 1962.

*Primary Examiner*—Ralph S. Kendall
*Attorney, Agent, or Firm*—J. Rosenstock

[57] ABSTRACT

A method of depositing a metal on a surface of a substrate is disclosed. The method comprises selectively coating portions of the surface with a colloidophobic material to render the portions colloidophobic and to delineate an exposed surface pattern which is capable of retaining a colloidal species thereon. The selectively coated surface is treated with a sol comprising a colloidal species selected from the group comprising (1) a species capable of reducing an activating metal ion to an activating metal, and (2) a colloidal activating metal species capable of participating in an electroless metal deposition to deposit the colloidal species on the exposed surface pattern.

45 Claims, 3 Drawing Figures

METHOD OF DEPOSITING A METAL ON A SURFACE

BACKGROUND OF THE INVENTION

1. Field of the Invention

This invention relates to a method of depositing a metal on a surface and more particularly, to a method of selectively depositing a metal on a surface of an electrically non-conducting substrate.

2. Discussion of the Prior Art

There is a growing need in various devices and circuit applications for an inexpensive process which will produce adherent conducting circuit patterns on a nonconductor surface. Most of the processes used for metallic pattern generation involve a photographic step. Pattern resolution may be good but most methods are often slow, involving many process steps, and are relatively expensive.

A conventional method of producing macro circuit patterns employs a copper-clad insulator board coated with a photoresist material which is photoexposed and chemically processed to selectively remove copper, leaving a desired circuit pattern. This method is effective but wasteful of copper and chemicals. The high cost of this method has encouraged research and development toward new techniques for metallic pattern generation on a non-conductor surface.

An electroless metal-deposition process is especially attractive for metallic pattern generation since one only needs to produce a pattern of a suitable catalyst on a substrate and metal desposition will occur only on that pattern. One selective electroless metal deposition, described in U.S. Pat. No. 3,632,435, prepares a substrate surface whereby the surface has divergent surface characteristics with respect to the retention of (1) a colloidal stannous salt, or (2) a colloidal noble metal applied from a bath containing a stannous salt and a noble metal salt. The divergent surface characteristics are obtained by rendering a selected area smooth as compared to another area (rough) or vice-versa. The relatively rougher area will retain the colloidal material upon treatment with a reactive stripper or destabilizing media whereas the smoother surface will not. The stripper materials include solutions of strong electrolytes or organic compounds which react with the colloidal tin or noble metal species. The use of roughening and/or smoothing expedients as well as the use of reactive strippers involves several process steps which lengthens the process and makes it relatively expensive.

A method for selective metal deposition utilizing an electroless metal-deposition technique without the use of roughening and/or smoothing expedients and/or reactive stripping or destabilizing expedients is desired and needed.

SUMMARY OF THE INVENTION

This invention relates to a method of depositing a metal on a surface and more particularly, to a method of selectively depositing a metal on a surface of an electrically non-conducting substrate.

The method comprises selectively coating portions of the surface with a colloidophobic material to render the portions colloidophobic and to delineate an exposed surface pattern capable of retaining a colloidal species thereon. The selectively coated surface is treated with a sol comprising a colloidal species selected from the group consisting of ($a^1$) a colloidal species capable of reducing an activating metal ion to an activating metal, and ($b^1$) a colloidal activating metal species capable of participating in an electroless metal deposition to deposit the colloidal species on the exposed surface pattern.

DESCRIPTION OF THE DRAWINGS

The present invention will be more readily understood by reference to the following drawing taken in conjunction with the detailed description, wherein.

DETAILED DESCRIPTION

The present invention will be discussed primarily in terms of selectively depositing Pd and Cu on a surface of an electrically insulative substrate by conventional screen or dry offset printing means. It will be readily appreciated that the inventive concept is equally applicable to depositing other suitable metals, which are catalytically reduced from their respective ions by catalytic activating metals (Pt, Pd, Ag). It will also be appreciated that the selective deposition may be carried out using any conventional printing technique such as lithography or wet offset, dry offset or letterset, letterpress, flexography, gravure, thermography, hot stamping and transfer printing techniques, as well as brushing and stenciling techniques.

Figure 1:
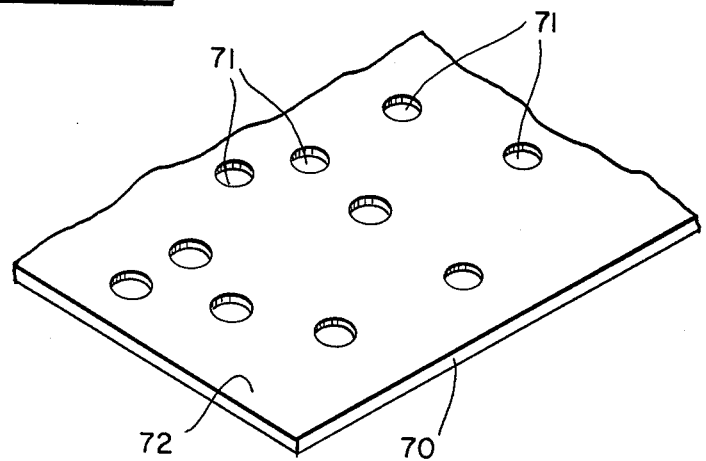
FIG. 1 is an isometric view of a portion of a typical substrate.

Referring to FIG. 1, a suitable substrate 70 is selected. For the production of electrical circuit patterns, suitable substrates are those which are generally electrically non-conductive. In general, all dielectric materials are suitable substrates. Dielectric materials commonly employed comprise a resinous material. If desired, the resinous material may incorporate fibrous reinforcement. For instance, paper or cardboard, glass fiber or other fibrous material may be impregnated with a phenolic, epoxy or fluorohydrocarbon (e.g., polytetrafluoroethylene) resinous material and pressed or rolled to a uniform thickness. Ceramic substrates may likewise be selected. Illustratively, substrate 70 is provided with a plurality of through-holes 71 which are drilled or punched in substrate 70 using any conventional technique known in the art.

Figure 2:
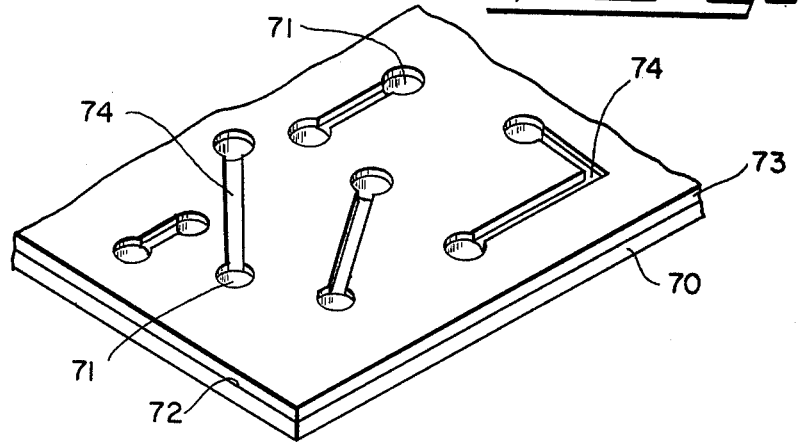
FIG. 2 is an isometric view of the portion of FIG. 1 which has been selectively coated with a colloidophobic material.

Substrate 70 may then be cleaned or degreased employing techniques well known in the art. Referring to FIGS. 1 and 2, a suitable colloidophobic material is selectively applied to portions of surface 72 of substrate 70 to form a colloidophobic coat or surface 73 which delineates an exposed surface pattern 74, including the walls of through-holes 71. The term "colloidophobic coat or surface," as employed herein, is defined as any surface having the ability to repel colloidal particles or conversely a surface having the inability to retain colloidal particles thereon. In other words, a "colloidophobic surface" is one which will not retain colloidal particles as, for example, when exposed to a sol containing such particles or be wetted thereby, whereas a colloidophilic surface is opposite thereto and will retain or be "wetted" by such a sol and retain the colloidal particles on its surface. It should be noted that the above definition of a "colloidophobic surface" does not refer to nor depend on surface roughness but on the contrary, when dealing with sols, depends upon the surface energies or tensions of (1) the surface, (2) the liquid (sol) with which the surface is to be treated or exposed, (3) the surface-liquid (sol) interface and (4) the surface vapor and liquid (sol) vapor interfaces.

A "colloidophobic material or agent," as used herein, means a material which renders a colloidophilic surface, i.e., a surface which will retain a colloidal species, into a colloidophobic surface, i.e., a surface which either repels a colloidal species or cannot retain a colloidal species to the extent it initially was capable (before exposure to the colloidophobic material or agent).

Suitable colloidophobic materials are those which lower the surface energy or tension of a substrate surface treated therewith or present a surface having a surface energy which has a relatively low value as compared to untreated portions of the substrate and as compared to the colloidal species containing medium, e.g., a sol. Particularly effective colloidophobic materials are compositions comprising (1) polytetrafluoroethylene

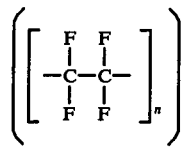

where n is about 1,000; (2) polyethylene (molecular weight of 1,500 – 100,000); (3) dimethoxy polysiloxanes having a structural formula of

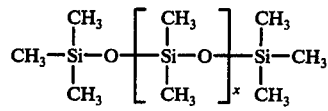

where x is the number of repeated units and having a viscosity ranging from 20 to 100,000 centipoises; (4) polyfluoroalkyl esters such as (a) polyperfluorooctyl methacrylate or (b) polyperfluoro lauryl methacrylate, both dissolved in a suitable solvent vehicle such as hexafluoroxylene; (5) perfluoro epoxy resins such as (a) the fully cured reaction product of the diglycidyl ether of 1,3 bis [2-hydroxyhexafluoro- 2-propyl]-5 -heptafluoropropyl benzene having the structural formula of

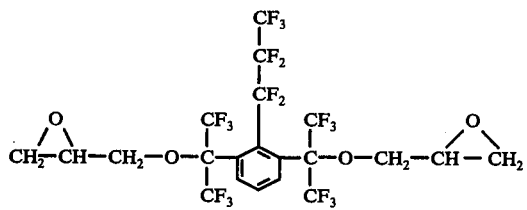

and 1,4 bis (aminomethyl) cyclohexane, having the structural formula

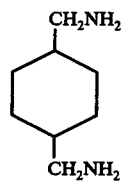

and (b) the fully cured reaction product of the diglycidyl ether of 1,3 bis [2-hydroxyhexafluoro-2-propyl]-5- pentadecafluoroheptyl benzene, having the structural formula of

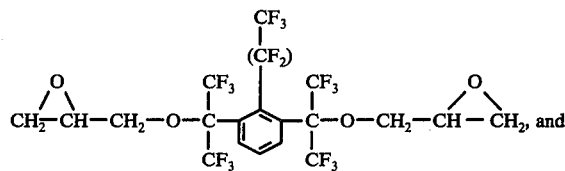

1,4 bis (aminomethyl) cyclohexane and of perfluoro tetradecane; (6) polyfluoroethanes; and (7) colloidal silicas having chemically bonded to the surface thereof amounts of from about 0.01 to about 30 percent by weight based on the weight of the silica of a disilizane treating material, such as described in U.S. Pat. No. 3,627,724. The disilazanes useful as treating materials with this invention have the general formula

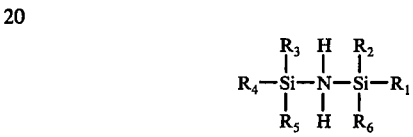

where $R_1$, $R_2$, $R_3$, $R_4$, $R_5$ and $R_6$ are alike or unlike alkyl radicals having from one to five carbon atoms.

Representative examples of the disilazane compounds which may be employed herein are hexamethyldisilazane, hexaethyldisilazane, hexapropyldisilazane, hexabutyldisilazane, trimethyltributyldisilazane, tripropyltributyldisilazane, dimethyltetrapropyldisilazane, tetrabutyldiethyldisilazane and the like.

The colloidal silicas are well known in the art and include non-porous silicas prepared by pyrogenic and precipitation processes, having an average ultimate particle diameter of less than about 0.5 micron and preferably less than about 0.1 micron.

The disilazane treated colloidal silica products of the present invention are readily prepared by metal pattern well known in the art. For example, the disilazane treated silicas may be obtained by brushing, dipping, or spraying the disilazane treating material, contacting the silica with vapors of the disilazane, or treating the silica with a solution of the disilazane material dissolved in a solvent. Another method for preparing the disilazane treated silacas involves reacting the disilazane with silica in a fluid bed at elevated temperatures. Another method is to prepare the disilazane treated silicas by a continuous process which entails continuously adding silica through a restricted passage into a flowing stream of atomized disilazane treating material. The continuous process is carried out at temperatures ranging from about 0° to about 450° C. and the resultant treated oxide is recovered downstream of the point where the silica is introduced. Additionally, if desired, a catalyst such as glacial acetic acid may be added to the reaction mixture to promote hydrolysis of the disilazane material.

The colloidophobic materials typically are in solution wherein they are combined with suitable solvents or liquid carriers. It is to be understood of course that the colloidophobic materials may be employed in the solid or dry state as well.

Typically, the colloidophobic material is in the form of an ink composition comprising a suitable liquid vehicle which is applied to surface 72 of substrate 70 using conventional printing techniques and dried or cured, if necessary, using conventional drying or curing techniques. One such conventional printing technique is screen printing. Another conventional printing technique is letterset printing. It is, or course, to be understood that the colloidophobic material, e.g., a colloidophobic ink, resin, etc., can be selectively applied to surface 72 using any conventional printing technique or other conventional techniques including but not limited to brushing, stenciling, etc.

Upon application of the colloidophobic material to surface 72, the colloidophobic material may be further treated, e.g., as by heating to affect a full cure of the material, whereby colloidophobic coat or surface 73 is incapable of retaining a catalyst species thereon upon exposure thereto. Exposed solution to pattern 74 retains its original capability of retaining (relative to surface 73) a colloidal species and upon exposure thereto will retain such colloidal species, e.g., colloidal stannous hydrous oxide particles contained in a hydrosol. It is to be noted and stressed hereat that unlike other prior art techniques, the resultant colloidophobic surface 73 and colloidophilic surface 74 do not have to have divergent physical characteristics such as relative roughness whereby the colloidal species will or will not be retained thereon. Typically, the surfaces (73, 74) do not differ markedly in porosity and/or surface roughness. Also, surprisingly, it has been found that colloidophobic inks or solutions applied to surface 72 of substrate 70 oftentimes result in surface 73 having relatively large pores or holes which nonetheless either do not accept or do not retain colloidal species on the surface underlying these holes. The reason for this is as yet undetermined.

The resultant substrate 70 having colloidophobic surface 73 and colloidophilic surface 74 is treated with a suitable sol containing a colloidal species capable of reducing a precious metal, e.g., palladium, platinum, silver, gold, from a salt solution thereof. A suitable sol includes at least one wetting hydrosol revealed in Kenney, U.S. Pat. No. 3,657,003, incorporated hereinto by reference. More specifically, the following wetting hydrosols revealed in Kenney may be employed:

(1) The blue wetting sol of Example III-A which is obtained by (a) adding particulated titanium metal [Ti°] to a hot or boiling (about 80° C.) concentrated monobasic acid, such as HCl, until 0.2–3 weight percent of the titanium is dissolved; (b) cooling the resultant solution to room temperature; and (c) slowly raising the initial pH with a univalent alkali such as NaOH, until it is within the range of about 1.0 to 1.5.

(2) The blue wetting sol of Example III-B which is obtained by (a) adding particulated titanium metal [Ti°] to a hot or boiling (about 80° C.) concentrated univalent acid, such as $HNO_3$, until 0.2–3 weight percent of the titanium is dissolved; (b) cooling the resultant solution to room temperature; and (c) slowly raising the initial pH, with a univalent alkali, such as NaOH, until it is within the range of about 1.0–1.4.

(3) The brown-red wetting sol of Example V-C which is obtained by (a) adding one-half weight percent of vanadium tetrachloride [$VCl_4$] to concentrated HCl; and (b) raising the pH to about 1, e.g., by diluting with $H_2O$.

(4) The green wetting sol of Example VI which is obtained by (a) dissolving one-half weight percent of chromic chloride in 100 ml. of deionized water; and (b) raising the initial pH to about 5 with a univalent alkali.

(5) The wetting sol of Example X-G which is obtained by (a) adding one weight percent of powdered ferrous oxide to 100 ml. of deionized water; (b) ultrasonically agitating the resultant mixture to dissolve the $Fe_2O_3$; and (c) lowering the initial pH (3.0–3.5) to about 1.0 with a univalent acid, such as HCl.

(6) The pale yellow wetting sol of Example XXVI-F which is obtained by (a) dissolving in 100 ml. of deionized water 0.1–5 weight percent of stannous chloride [$SnCl_4$] in any proportion to each other; and (b) adjusting the pH to about 0.7–1.8.

(7) The pale yellow wetting sol of Example XXVI-G which is obtained by (a) dissolving 1 weight percent of powdered stannic chloride [$SnCl_4.5H_2O$] in 100 ml. of deionized water; (b) dissolving 2 weight percent of stannous chloride [$SnCl_2.2H_2O$] therein; and (c) dissolving an additional 1.5 weight percent stannous chloride [$SnCl_2.2H_2O$].

(8) The pale yellow wetting sol of Example XXVI-H which is obtained by (a) dissolving 1 weight percent of stannous chloride [$SnCl_2.2H_2O$] in 100 ml. of deionized water; (b) adding sufficient HCl thereto to lower the pH to about 0.5–1.5; and (c) heating the resultant solution at about 55° C. for 2 hours or in the alternative, adding $H_2O_2$ in place of or in addition to the heating step.

(9) The colorless (milky white) wetting sol of Example XXVII which is obtained by (a) dissolving 1 weight percent of either lead chloride [$PbCl_2$] or lead nitrate [$Pb(NO_3)_2$] in 100 ml. of deionized water; and (b) slowly raising the initial pH of the resultant solution with a dilute univalent alkali, such as NaOH, to a pH of about 6–7.

(10) The colorless (milky white) wetting sol of Example XXVIII which is obtained by (a) dissolving 1 weight percent of bismuth trichloride [$BiCl_3$] in 100 ml. of dilute (pH about 2) HCl; and (b) raising the pH of the resultant solution to about 3.4 with NaOH.

(11) The wetting sol of Example XXXIII-A which is obtained by (a) adding 1 gram of fused titanium metal [Ti°] to 70 ml. of concentrated HCl, which is boiled until the solution assumes a blue color; (b) maintaining a heat input without boiling the resultant solution until all of the titanium is dissolved and reacted to give a blue-purple solution having a very low pH; (c) raising the pH to about 0.5 with 1N-NaOH resulting in a pale lavender solution; (d) adding dilute 50% $H_2O_2$ until the solution is colorless, and then adding two additional drops in excess; (e) raising the pH with 1N-NaOH to about 1.0–1.2, resulting in a pale yellow solution; and (f) adding 1 weight percent of stannous chloride to 100 ml. of the pale yellow solution.

(12) The pumpkin colored wetting sol of Example XXXIII-B which is obtained by (a) dissolving 1 weight percent of ferric chloride [$FeCl_3.6H_2O$] in 100 ml. of deionized water (aiding dissolution by gradually heating to about 50°–80° C. and stirring), resulting, at a pH of about 1.7–1.9, in a tan solution; and (b) dissolving 2 weight percent stannous chloride [$SnCl_2.2H_2O$] in 100 ml. of the tan solution thereby lowering the pH to about 1.5.

(13) The wetting sol of Example XXXIII-C which is obtained by (a) heating 100 ml. of deionized water to about 60° C.; (b) adding 1 weight percent of aluminum chloride [$AlCl_3.6H_2O$] thereto; (c) raising the initial pH (about 2.5) to about 5.0–5.2 while the solution is still hot, with a univalent alkali such as 1N-NaOH, (d) cooling the solution to room temperature; and (e) dissolving 0.1 weight percent of stannous chloride [$SnCl_2.2H_2O$] therein.

(14) The pale yellow wetting sol of Example XXXIII-D which is obtained by dissolving 1 weight percent of ferric chloride [$FeCl_3.6H_2O$] and 1 weight percent of stannous chloride [$SnCl_2.2H_2O$] in 100 ml. of deionized water.

(15) The pale yellow wetting sol of Example XXXIII-E which is obtained by (a) dissolving 1 weight percent of ferric chloride [$FeCl_3.6H_2O$] and 1 weight percent of stannous chloride [$SnCl_2.2H_2O$] in 100 ml. of deionized water; and (b) dialyzing the solution to a final pH of about 5–5.5.

(16) The colorless (milky white) wetting sol of Example XXXIII-F which is obtained by adding 1 weight percent of stannous chloride [$SnCl_2.2H_2O$] to a suspension of "CAB-O-SIL" in 100 ml. of deionized water. "CAB-O-SIL" is a fumed silica made by flame hydrolysis.

(17) The yellow wetting sol of Example XXXIII-G which is obtained by (a) dissolving 1–2 weight percent of stannic chloride [$SnCl_4.5H_2O$] in 100 ml. of deionized water and (b) adding 1–5 weight percent of zinc metal thereto with stirring until complete dissolution thereof.

(18) The yellow wetting sol of Example XXXIII-H which is obtained by (a) dissolving 1–3 weight percent of stannous chloride [$SnCl_2.2H_2O$] in 100 ml. of deionized water; (b) adding sufficient HCl to clear the solution, the final pH of the cleared solution being 0.5–1.0; and (c) dissolving 1 weight percent of zinc metal therein.

(19) The green wetting sol of Example XXXIII-I which is obtained by (a) dissolving 0.5 percent of chromic Chloride [$CrCl_6.6H_2O$] in 100 ml. of deionized water; (b) adding 0.25 weight percent of zinc metal to the solution; (c) allowing the solution to stand ambient for at least 48 hours; (d) adding stannous chloride [$SnCl_2.2H_2O$] to the solution in a weight concentration of 0.1 percent per 100 ml.; and (e) slowly adding 1N-NaOH to the solution to adjust the pH to the range 5.1–5.4.

(20) The wetting sol of Example XXXIII-J which is obtained by (a) adding 1 weight percent of powdered aluminum chloride [$AlCl_3$] to 100 ml. of deionized water; (b) raising the pH to about 5.2 with a univalent alkali such as NaOH; (c) heating the solution for about 2 hours at about 60° – 80° C.; (d) adding 0.5–2 weight percent of stannous chloride [$SnCl_2.2H_2O$] to form a flocculant; (e) decanting the supernatant portion of the solution which portion is the colloid wetting solution and additionally (f) adding 0.01M-HCl to the flocculant to form the wetting solution also.

The sols of Examples III-A, III-B, V-C, VI, X-G, XXVI-F, XXVI-G, XXVI-H, XXVII, XXVIII, XXXIII-A, XXXIII-B, XXXIII-C, XXXIII-D, XXXIII-E, XXXIII-F, XXXIII-G, XXXIII-H, XXXIII-I, and XXXIII-J (described above) comprise metal ions ($Ti^{+3}$, $V^{+4}$, $Cr^{+3}$, $Fe^{+2}$, $Sn^{+2}$, $Pb^{+2}$, $Bi^{+3}$) in insoluble hydrous oxide form, which are capable of reducing an activating metal ion, e.g., $Pd^{+2}$, to an activating metal, e.g., Pd, upon exposure to an activating solution, e.g., a $PdCl_2$ solution.

It is to be pointed out that in general stannous chloride while present in aqueous hydrochloric acid does not form a true solution, but rather a colloidal suspension which may be termed a sol. Accordingly, such sols are suitable for practicing the subject invention.

Upon treatment or contact with the sol, the colloidal species contained therein, e.g., colloidal hydrous oxide particles of tin ($Sn^{+2}$), are deposited on exposed surface 74 to form a film or coat thereon (not shown) thereof. Substrate 70 is then treated, e.g., rinsed, with a suitable inert rinsing agent, e.g., water, whereby excess sol is removed from the surfaces of substrate 70 including colloidophobic surface 73. It is to be pointed out, however, that colloidophilic surface 74 retains the colloidal species thereon despite repeated and/or prolonged treatment, e.g., prolonged water rinsing. By an inert rinsing agent is meant any solution or agent which will remove excess sol from the surfaces of substrate 70 including colloidophobic surface 73 without chemically reacting with the sol including the colloidal species contained therein. Some typical suitable inert rinsing agents include liquid aliphatics; alcohols, e.g., methanol, ethanol, etc.; chlorinated hydrocarbons, e.g., chloroform, trichloroethylene, carbon tetrachloride, etc.; and ethers. A preferred rinsing agent comprises water.

Figure 3:
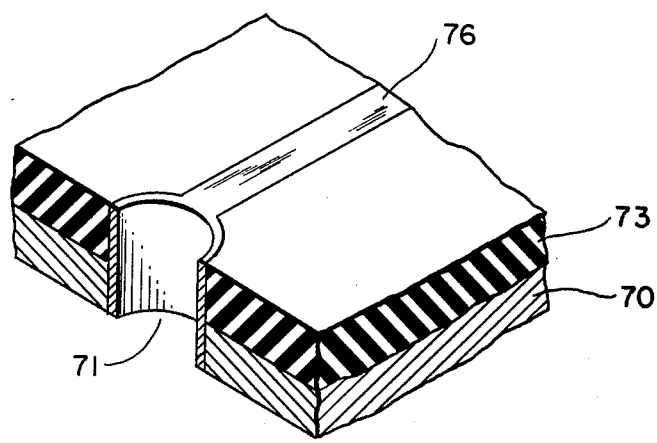
FIG. 3 is an isometric view of the substrate of FIG. 2 having a deposited metal pattern thereon.

The colloidal species deposited substrate 70 is then activated, i.e., is exposed in a conventional manner, e.g., by immersion, to an activating solution, e.g., an aqueous $PdCl_2$ solution, containing an activating metal ion, e.g., $Pd^{+2}$, wherein the activating metal ion, e.g., $Pd^{+2}$, is reduced to the metal, e.g., Pd, and deposited on area 74 of the substrate 70 in the form of a catalytic activating metal pattern. The patterned, activating metal-deposited substrate 70 may then be water rinsed and is then immersed in a conventional electroless metal deposition solution wherein an electroless metal ion. e.g., $Cu^{+2}$, $Ni^{+2}$, is reduced to the metal, e.g., Cu°, Ni° and deposited on surface 74 of substrate 70 to form an electroless metal deposit 76 as shown in FIG. 3. The electroless metal deposit 76 may be built up to a desired thickness by prolonged immersion in the electroless metal deposition solution or alternatively may be further built up by being electroplated in a standard electroplating bath.

In a second embodiment of the present invention referring back to FIG. 2, a substrate 70 is treated with a sol containing a colloidal activating metal species capable of participating in an electroless metal deposition, to deposit the colloidal activating metal species, e.g., a hydrous oxide of palladium, on exposed surface 74 to form a film or coat thereon (not shown). By a suitable activating species which can participate in an electroless metal deposition is meant either (1) an activating species which in its initial state is incapable of functioning as a catalytic species or metal but which is capable of being reduced to a catalytic species, such as a metal, capable of functioning as a reduction catalyst in an autocatalytic electroless deposition process, or (2) an activating species which in its initial state is capable of functioning as such a catalytic species.

Some suitable activating sols capable of reduction to such a catalytic species include those revealed in Kenny, U.S. Pat. No. 3,657,003. In particular, some of these sols are:

(1) The brown wetting sol of Example XIII-A which is obtained by (a) adding one weight percent of palladium chloride [$PdCl_2$] to 100 ml. of deionized water; and (b) stirring the resultant mixture to dissolve the maximum amount of $PdCl_2$.

(2) The brown wetting sol of Example XIII-B which is obtained by (a) adding 10 ml. of 5 weight percent palladium chloride [$PdCl_2$] to 100 ml. of deionized water; and (b) raising the initial pH to about 3.0–3.2 with 1N-NaOH.

(3) The yellow wetting sol of Example XIV which is obtained by (a) dissolving one percent of platinous dichloride [$PtCl_2$] in 100 ml. of hot (70° C.), dilute HCl; (b) cooling the resultant solution; and (c) raising the pH of the cooled solution to about 3 with a univalent alkali.

(4) The wetting sol of Example XVI which is obtained by dissolving $\frac{1}{4}$-$\frac{1}{2}$ weight percent of silver nitrate [$AgNO_3$] in either 100 ml. of deionized water or in 100 ml. of 50 percent deionized water and 50 percent ethyl alcohol and rapidly raising the pH to an ultimate value of 8-9 with a univalent alkali such as KOH or NaOH.

(5) The brown wetting sol of Example XVII-A which is obtained by (a) dissolving one weight percent of auric chloride [$AuCl_3$] in 100 ml. of deionized water; and (b) slowly raising the pH to about 4-5 with a univalent alkali while stirring and heating (30°-40° C. ) the resultant solution.

(6) The yellow wetting sol of Example XVII-B which is obtained by (a) dissolving $\frac{1}{2}$-1 weight percent of auric chloride in 100 ml. deionized water; and (b) slowly evaporating the resultant solution in ambient until one-fifth of the volume remains [2–4 weeks].

(7) The brown wetting sol of Exampel XVII-C which is obtained by (a) dissolving 1 weight percent of auric chloride in 100 ml. of deionized water; and (b) raising the pH of the resultant solution to about 4 with NaOH.

Substrate 70 is then treated with the inert rinsing agent, e.g., is rinsed with water, to remove excess sol therefrom. The colloidal activating metal species, deposited and retained, is capable of participating in an electroless metal deposition catalysis. That is, the activating metal species (associated, e.g., an insoluble hydrous oxide of palladium; dissociated, e.g., $Pd^{+2}$ ions) contained in the above-described wetting sols and retained on surface 74 is capable of forming a catalytic metal (a metal capable of functioning as a reduction catalyst in an autocatalytic electroless process), e.g., by being reduced thereto by a suitable reducing agent such as $Sn^{+2}$ ions or

(alone or combined in an electroless plating solution).

The colloidal activating metal species deposited substrate 70 is then treated by a solution comprising a reducing species, e.g., $Sn^{+2}$ ions, capable of reducing the retained activating metal species to an activating metal, e.g., Pd. Upon such treatment, the activating metal ion. e.g., $Pd^{+2}$, $Pt^{+2}$, etc., is reduced to the activating metal, e.g., Pd, Pt, and deposited on patterned surface 74 as a catalytic coat or pattern. The activating metal-deposited catalyst pattern is then subjected to a conventional electroless metal plating bath to obtain the metal-deposited pattern 76 (FIG. 3). Again, pattern 76 may be built up to a desired thickness by continued electroless deposition or alternatively the electroless metal-deposited pattern 76 may be electroplated using conventional electroplating techniques and plating baths.

It is to be noted and stressed hereat that it has surprisingly been found that the wetting sols of U.S. Pat. No. 3,657,003, described above, do not deposit adherent colloidal particles on colloidophobic surface 73, even though such sols normally deposit such adherent colloidal particles which withstand repeated rinsing with water.

Suitable colloidal sols comprising activating species, capable of participating in an electroless metal deposition, by initially being capagle of functioning as a reduction catalyst for the electroless metal deposition, exist as so-called "one-step activators." The substrate 70 may be treated with such a colloidal one-step activator whereby metallic palladium is initially deposited only on surface 73. One such typical colloidal one-step activator, revealed in U.S. Pat. No. 3,011,920, contains stannous chloride, palladium chloride and aqueous hydrochloric acid. Colloidal palladium is formed by the reduction of the palladium ions by the stannous ions of the stannous chloride. Simultaneously, stannic oxide colloids are formed together with adsorbed stannic oxychloride and stannic chloride. The stannic acid colloids comprise protective colloids for the palladium colloids while the oxychloride constitutes a deflocculating agent further promoting the stability of the resulting colloidal solution. The relative amounts of the above ingredients can be varied provided the pH is below about 1 and provided excess stannous ions are maintained.

Another suitable colloidal one-step activator, revealed in U.S. Pat. No. 3,532,518 incorporated hereinto by reference, comprises acid palladium metal-stannous chloride sols.

When employing such one-step activators it is unnecessary to form or apply a further layer of a noble metal species on surface 74 since the activating metal species deposite is initially capable of participating in an electroless metal deposition catalysis. Accordingly, the thus one-step activator treated substrate 70 can be rinsed, as for example with water, and immediately immersed in a suitable electroless metal deposition bath.

It is to be noted that the various typical conventional activators, activating solutions, electroless and electroplating solutions, activating and plating conditions and procedures are well known in the art and will not be elaborated herein. Reference in this regrad is made to *Metalic Coating of Plastics*, William Goldie, Electrochemical Publications, 1968.

In another embodiment, a surface of a hydrophobic substrate, e.g., a polyimide body, can be selectively rendered hydrophilic. A hydropobic surface is selectively treated with the colloidophobic material, as described above, and is then treated with any of the wetting hydrosols described in Kenney, U.S. Pat. No. 3,657,003, incorporated hereinto by reference. The colloidal species (insoluble hydrous oxides of one or more of the elements Be, Mg, Ti, Zr, V, Cr, Mo, W, Mn, Fe, Co, Ni, Pd, Pt, Cu, Ag, Au, Zn, Cd, Hg, Al, In, Tl, Si, Ge, Sn, Pb, Bi, La, Ce, Th, U) contained in such wetting hydrosols are retained on those surface areas which remain colloidophilic but not on the colloidophobic areas, as described above. The colloid deposited areas are thus rendered hydrophilic and can be selectively wetted by aqueous solutions.

EXAMPLE I

A colloidophobic ink was prepared by mixing (1) 22 grams of a screening medium comprising 8 percent by weight ethyl cellulose and 92 percent by weight β-terpineol; and (2) 9 grams of a commercially obtained colloidal silica having chemically bonded to the surface thereof amounts of from about 0.01 to about 30 percent by weight based on the weight of silica of hexamethyldisilizane. The resultant ink was then conventionally screen printed and dried at 70° C. for 30 minutes in a pattern on a surface of each of the following substrates: (1) an epoxy-glass laminate; (2) an epoxy-coated metal laminate; (3) a rubber-modified epoxy base; to form a colloidophobic inked surface pattern thereon which delineated an exposed colloidophilic surface pattern.

late monomer and its prepolymer having a structural formula of

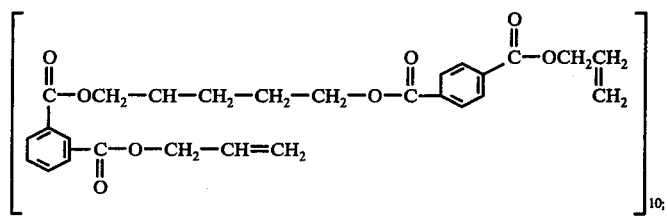

A colloidal sensitizing sol was prepared by dissolving ten grams of $SnCl_2$, 10 ml. of concentrated hydrochloric acid (37 weight percent aqueous HCl) in 1l. of deionized water. The inked substrates were immersed in the resultant sensitizing sol for one minute at 25° C. and then rinsed with deionized water at 25° C. for one minute. The thus sensitized substrates were then activated in a 0.05 percent by weight aqueous $PdCl_2$ solution (pH = 2.2) by immersion therein at 25° C. for two minutes. The thus activated substrates were then immersed for 10 minutes at 25° C. in an electroless copper plating solution comprising 15 grams/l. of solution of cupric sulfate, 3 grams/l. of solution of $NiSO_4 \cdot 6H_2O$, 9 grams/l. of solution of formaldehyde, 30 grams/l. of solution of sodium potassium tartrate, 8 grams/l. of solution of NaOH and 1 ppm $Na_2SO_3 \cdot 7H_2O$ wherein an electroless copper pattern corresponding to non-inked, exposed areas of each substrate surface, having a thickness of $10\mu$ inches was obtained. There was no metal deposition on the inked areas of any of the substrate surfaces.

EXAMPLE II

The procedure of Example I was repeated except that the colloidophobic ink comprised 28 grams of the screening medium and 6 grams of the hexamethyldisilizane bonded silica. Substantially the same results were obtained.

EXAMPLE III

The procedure of Example I was repeated except that the colloidophobic ink comprised (1) 30 grams of the screening medium of Example I; and (2) 31 grams of micronized polytetrafluoroethylene. Substantially the same results were obtained.

EXAMPLE IV

The procedure of Example I was repeated except that the ink comprised 31 grams of the screening medium of Example I and 20 grams of micronized polytetrafluoroethylene. Substantially the same results were obtained.

EXAMPLE V

The procedure of Example I was repeated except that the colloidophobic ink comprised (1) 25 grams of the screening medium of Example I; (2) 2 grams of the hexamethyldisilizane bonded silica; and (3) 9 grams of micronized polytetrafluoroethylene. Substantially the same results were obtained.

EXAMPLE VI

The procedure of Example V was repeated except that the ink comprised (1) a screening medium comprising 42 grams of a photoresist material comprising 22.5 weight percent of a mixture comprising diallylisophthalate monomer and its prepolymer having a structural formula of 42.5 weight percent xylene, 35.3 weight percent pentoxane, 0.1 weight percent benzil, 0.1 weight percent p,p'-bis-dimethylaminobenzophenone and 0.4 weight percent xanthone; (2) 3 grams of the hexamethyldisilizane silica; and (3) 33 grams of the micronized polytetrafluoroethylene. Substantially the same results were obtained.

EXAMPLE VII

The procedure of Example VI was repeated except that the colloidophobic ink comprised (1) 40 grams of the screening medium of Example VI; (2) 8 grams of the hexamethyldisilizane silica; and (3) 10 grams of benzene. Substantially the same results were obtained.

EXAMPLE VIII

The procedure of Example I was repeated except that the ink was prepared by mixing (1) 6.8 grams of a first commercially obtained uncured diglycidyl ether of bispehnol A having an epoxide equivalent of 450 to 525, an equivalent weight of 145 and a melting point ranging from 64° to 76° C.; (2) 6.3 grams of a second commercially obtained, uncured diglycidyl ether of bisphenol A having an epoxide equivalent of 870–1000, an equivalent weight of 175 and a melting point ranging from 95° C. to 105° C.; (3) 13.1 grams of 2-butoxy ethanol, (4) 1.0 gram of 2,6 xylenyl biguanide having the structural formula

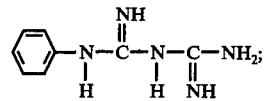

and (5) 7.0 grams of a commercially obtained micronized polytetrafluoroethylene. The ink was applied by a dry offset (letterset) printing technique. After application to the surface of each substrate, the substrate was heated at 175° C. for 60 minutes to obtain a full cure of the ink as evidenced by the glass transition temperature, chemical resistance and mechanical impact measurements.

EXAMPLE IX

The procedure of Example VIII was repeated except that the ink comprised (1) 6.6 grams of the first uncured diglycidyl ether; (2) 6.6 grams of the second uncured diglycidyl ether; (3) 33.2 grams of 2-butoxy ethanol; (4) 4.7 grams of the hexamethyldisilizane bonded silica of Example I; (5) 15 grams of micronized polytetrafluoroethylene; and (6) 1 gram of 2,6 xylenyl biguanide. Substantially the same results were obtained.

EXAMPLE X

The procedure of Example IX was repeated except that 25.4 grams of micronized polytetrafluoroethylene was employed. Substantially the same results were obtained.

EXAMPLE XI

The procedure of Example IX was repeated except that the ink comprised (1) 6.5 grams of the first uncured diglycidyl ether; (2) 6.5 grams of the second uncured diglycidyl ether; (3) 33 grams of 2-butoxy ethanol; (4) 1 gram of 2,6 xylenyl biguanide and (5) 20 grams of micronized polyethylene (20μ particle size). Substantially the same results were obtained.

EXAMPLE XII

The procedure of Example VIII was repeated except that the colloidophobic ink was prepared by mixing (1) 522 grams of a diglycidyl ether of bisphenol A, having an epoxide equivalent weight of 2000–2500, and a Durran's softening point of 125°–135° C.; and (2) 326 grams of a mixture comprising 60 weight percent of a butylated urea formaldehyde resin and 40 weight percent of xylol/butanol (1:1), having an acid number of 2 to 5. The full cure was attained by heating at 175° C. for 15 minutes. Substantially the same results were obtained.

EXAMPLE XIII

The procedure of Example XI was repeated except that the colloidophobic ink was prepared by mixing 75 grams of a colloidophobic ink of Example XI with 100 grams of paraffin wax. Substantially the same results were obtained.

EXAMPLE XIV

The procedure of Example XI was repeated except that the colloidophobic ink was prepared by mixing together (1) 38 grams of the ink mixture of Example XI; (2) 25 grams of the hexamethyldisilizane bonded silica of Example I; and (3) 200 grams of 2-butoxy-ethanol. Substantially the same results were obtained.

EXAMPLE XV

A colloidophobic material was prepared by mixing (1) 10 grams of the diglycidyl ether of 1,3 bis [2-hydroxyhexafluoro-2-propyl]-5 heptafluoro propyl benzene with 1 gram of 1,4 bis [aminomethyl] cyclohexane. The mixture was then applied using a stenciling technique on the substrates of Example I. The substrates were then heated to a temperature of 70° C. for one hour whereby a fully cured reaction product (colloidophobic material) of the mixture was obtained to form a colloidophobic surface pattern thereon which delineated an exposed colloidophilic surface pattern. The sensitizing, activating and electroless metal deposition procedure of Example I was then carried out whereby an electroless copper pattern corresponding to exposed areas of each substrate surface, having a thickness of 10μ inches was obtained. There was no metal deposition on the colloidophobic areas of any of the substrate surfaces.

EXAMPLE XVI

The procedure of Example XV was repeated except that the reaction mixture comprised (1) 12.7 grams of the diglycidyl ether of 1,3 bis [2-hydroxyhexafluoro-2-propyl]-5-pentadecafluoroheptyl benzene; (2) one gram of 1,4 bis (aminomethyl) cyclohexane; and (3) one gram of perfluoro tetradecane. A fully cured reaction product was obtained by heating the mixture (on the substrates) at 70° C. for one hour. Substantially the same results of Example XV were obtained.

EXAMPLE XVII

The procedure of Example XV was repeated except that the reaction mixture comprised (1) 4 grams of 1,3-(2-hydroxyhexafluoro-2-propyl) benzene; (2) 2 grams of hexafluoropentane-1,5-diol; (3) 2 grams of epichlorohydrin; and (4) one gram of toluene diisocyanate. The substrates were heated at 70° C. for one hour whereby a fully cured reaction product comprising a polyperfluorourethane was obtained. Substantially the same results of Example XV were obtained.

EXAMPLE XVIII

A colloidophobic material consisting of polyperfluorolauryl methacrylate dissolved in hexafluoro xylene was applied using a stenciling technique on the substrates of Example I. The material was then dried at room temperature. The sensitizing, activating and electroless metal deposition procedure of Example I was then carried out. Substantially the same results as in Example I were obtained.

EXAMPLE XIX

The procedure of Example XVIII was repeated except that the colloidophobic material consisted of polyperfluoro octyl methacrylate dissolved in hexafluoro xylene. Substantially the same results as in Example I were obtained.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of depositing a metal on a surface capable of retaining a colloidal species thereon which comprises:
    (a) selectively coating a portion of the surface with a colloidophobic material selected from the group of colloidophobic materials consisting of (1) a composition comprising dimethoxy polysiloxane having a viscosity ranging from 20 to 100,000 centipoise, (2) a composition comprising a polyfluoroalkyl ester, (3) a composition comprising a perfluoro epoxy resin, and (4) a composition comprising a colloidal silica having chemically bonded to the surface thereof amounts of from about 0.01 to about 30 percent by weight based on the weight of the silica of a disilizane compound having the general formula

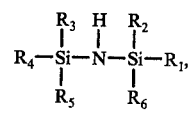

wherein $R_1$, $R_2$, $R_3$, $R_4$, $R_5$ and $R_6$ are like or unlike radicals selected from the group consisting of alkyl having one to five carbon atoms to render said portion collodiophobic and to delineate an exposed surface pattern capable of retaining a colloidal species thereon; and (b) treating said selectively coated surface with a sol comprising a colloidal species selected from the group consisting of ($a^1$) a colloidal species capable of reducing an activating metal ion to an activating metal, and ($b^1$) a colloidal activating metal species capable of participating in an electroless metal deposition to deposit said colloidal species on said exposed surface pattern.

2. The method as defined in claim 1 which further comprises forming an electroless metal deposition catalyst pattern by:

exposing said deposited pattern to an activating metal ion, when said deposited colloidal species comprises ($a^1$), to deposit an activating metal thereon; or exposing said deposited pattern to a suitable reducing species, when said deposited species comprises ($b^1$), and where said colloidal activating metal species is capable of being reduced to a reduction catalyst in an electroless process, to reduce said activating metal species to deposit an activating metal thereon.

3. The method as defined in claim 2 which further comprises exposing said catalyst pattern to an electroless metal deposition solution to deposit an electroless metal thereon.

4. The method as defined in claim 3 which further comprises electroplating said deposited electroless metal pattern to electrodeposit a metal thereon.

5. The method as defined in claim 1 which further comprises treating said sol treated surface with an inert rinsing agent to remove excess portions of said sol from said sol treated surface.

6. The method as defined in claim 5 wherein said inert reagent comprises an aqueous solution.

7. The method as defined in claim 1 wherein said colloidophobic material comprises said composition comprising said colloidal silica.

8. The method as defined in claim 1 wherein said polyfluoroalkyl ester is selected from the group consisting of polyperfluoro octyl methacrylate and polyperfluoro lauryl methacrylate.

9. The method as defined in claim 1 wherein said perfluoro epoxy resin is selected from the group consisting of (a) the reaction product of a reaction mixture comprising the diglycidyl ether of 1,3 bis [2-hydroxyhexafluoro-2-propyl]-5-heptafluoro-propyl benzene and 1,4 bis (aminomethyl) cyclohexane and (b) the reaction product of a reaction mixture comprising the diglycidyl ether of 1,3 bis [2-hydroxyhexafluoro-2-propyl]-5-pentadecafluoro-heptylbenzene, 1,4 bis (aminomethyl) cyclohexane and perfluorotetradecane.

10. The method as defined in claim 1 wherein in step (b) said selectively coated surface is treated with a stable aqueous sol comprising colloidal particles of a hydrous oxide of an element selected from the group consisting of Ti, V, Cr, Fe, Sn, Pb, Bi and mixtures thereof.

11. The method as defined in claim 1 wherein in step (b) said selectively coated surface is treated with a stable aqueous sol comprising colloidal particles of hydrous oxide of Pd, Pt, Ag and Au.

12. The method as defined in claim 1 wherein said deposited species comprises ($b^1$) which is initially capable of catalyzing an electroless metal deposition and which further comprises treating said deposited surface with an electroless metal deposition solution to deposit an electroless metal thereon.

13. A method of depositing a metal pattern on a surface, capable of retaining a colloidal species thereon, which comprises:

(a) coating a portion of the surface with a colloidophobic material selected from the group of colloidophobic materials consisting of (1) a composition comprising dimethoxy polysiloxane having a viscosity ranging from 20 to 100,000 centipoise, (2) a composition comprising a polyfluoroalkyl ester, (3) a composition comprising a perfluoro epoxy resin, and (4) a composition comprising a colloidal silica having chemically bonded to the surface thereof amounts of from about 0.01 to about 30 percent by weight based on the weight of the silica of a disilizane compound having the general formula

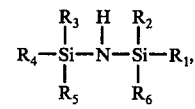

wherein $R_1$, $R_2$, $R_3$, $R_4$, $R_5$ and $R_6$ are like or unlike radicals selected from the group consisting of alkyl having one to five carbon atoms to render the surface energy of said portion lower relative to untreated portions to render said treated portion colloidophobic and to delineate an untreated surface pattern corresponding to the metal pattern; and (b) treating said coated surface with a sol having a higher surface energy relative to the colloidophobic surface to adherently deposit and retain on said delineated surface pattern colloidal particles selected from the group consisting of ($a^1$) colloidal particles comprising a species capable of reducing an activating metal ion to an activating metal, and ($b^1$) colloidal particles comprising an activating metal species capable of participating in an electroless metal deposition.

14. The method as defined in claim 13 wherein said colloidophobic material comprises said composition comprising said colloidal silica.

15. The method as defined in claim 13 wherein said polyfluoroalkyl ester is selected from the group consisting of polyperfluoro octyl methacrylate and polyperfluoro lauryl methacrylate.

16. The method as defined in claim 13 wherein said perfluoro epoxy resin is selected from the group consisting of (a) the reaction product of a reaction mixture comprising the diglycidyl ether of 1,3 bis [2-hydroxyhexafluoro-2-propyl]-5-heptafluoro-propyl benzene and 1,4 bis (aminomethyl) cyclohexane and (b) the reaction product of a reaction mixture comprising the diglycidyl ether of 1,3 bis [2-hydroxyhexafluoro-2-propyl]-5-pentadecafluoro-heptyl benzene, 1,4 bis (aminomethyl) cyclohexane and perfluorotetradecane.

17. The method as defined in claim 13 wherein in step (b) said selectively coated surface is treated with a stable aqueous sol comprising colloidal particles of hydrous oxide of an element selected from the group consisting of Ti, V, Cr, Fe, Sn, Pb, Bi and mixtures thereof.

18. The method as defined in claim 13 wherein in step (b) said selectively coated surface is treated with a stable aqueous sol comprising colloidal particles of a hydrous oxide of Pd, Pt, Ag and Au.

19. The method as defined in claim 13 which further comprises rinsing said sol-treated surface with an inert agent to remove excess portions of said sol from said sol-treated surface.

20. The method as defined in claim 19 which further comprises:
when said deposited colloidal particles comprise (a¹), exposing said deposited pattern to an activating metal ion to deposit an activating metal thereon to form an activating metal pattern.

21. The method as defined in claim 20 which further comprises exposing said activating metalpattern to an electroless metal deposition solution to deposit an electroless metal thereon.

22. The method as defined in claim 21 which further comprises elctroplating said deposited electroless metal pattern to electrodeposit a metal thereon.

23. The method as defined in claim 19 wherein:
said selected species (b¹) comprises an activating metal species capable of being reduced to a reduction catalyst in a elctroless metal deposition process; and
which further comprises threating said deposited pattern with a suitable reducing species to reduce said activating metal species to said catalyst to form a catalyst pattern.

24. The method as defined in claim 23 which further comprises exposing said atalyst pattern to an electroless metal deposition solutionto deposit an electroless metal thereon.

25. The method as defined in claim 19 wherein:
said selected species (b¹) comprises an activating metal species initially capable of functioning as a reduction catalyst in an electroless metal-deposition process, and
which further comprises exposing said deposited pattern to an electroless metal deposition solution to deposit an electroless metal thereon.

26. A method of rendering an article, capable of retaining thereon a collodial species, selectively capable of reducing thereon a precious metal from a precious metal salt, which comprises:
selectively coating a portion of the article with a colloidophobic material selected from the group of colloidophobic materials consisting of (1) a composition comprising a dimethoxy polysiloxane having a viscosity ranging from 20 to 100,000 centipoise, (2) a composition comprising a polyfluoroalkyl ester, (3) a composition comprising a perfluoro epoxy resin, and (4) a composition comprising a colloidal silica having chemically bonded to the surface thereof amounts of from about 0.01 to about 30 percent by weight based on the weight of the silica of a disilizane compound having the general formula

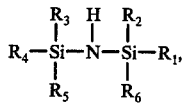

wherein $R_1$, $R_2$, $R_3$, $R_4$, $R_5$ and $R_6$ are like or unlike radicals selected from the group consisting of alkyl having one to five carbon atoms to delineate a colloidophobic surface pattern and a colloidophilic surface pattern;
treating said selectively coated article with a sol comprising a colloidal species capable of reducing a precious metal ion to a precious metal to deposit said colloidal species thereon;
treating said deposited article with an inert rinsing agent to remove excess portions of said sol from at least said colloidophobic pattern; and
exposing said deposited colloidophilic pattern to a precious metal ion to reduce and deposit a precious metal thereon.

27. The method as defined in claim 26 wherein said colloidophobic material comprises said composition comprising said colloidal silica.

28. The method as defined in claim 26 wherein said polyfluoroalkyl ester is selected from the group consisting of polyperfluoro octyl methacrylate and polyperfluoro lauryl methacrylate.

29. The method as defined in claim 26 wherein said perfluoro epoxy resin is selected from the group consisting of (a) the reaction product of a reaction mixture comprising the diglycidyl ether of 1,3 bis [2-hydroxyhexafluoro-2-propyl]-5-heptafluoro-propyl benzene and 1,4 bis (aminomethyl) cyclohexane and (b) the reaction product of a reaction mixture comprising the diglycidyl ether of 1,3 bis [2-hydroxyhexafluoro-2-propyl]-5-penta decafluoro-heptyl benzene, 1,4 bis (aminomethyl) cyclohexane and perfluorotetradecane.

30. The method as defined in claim 26 where in step (b) said selectively coated surface is treated with a stable aqueous sol comprising colloidal particles of a hydrous oxide of an element selected from the group consisting of Ti, V, Cr, Fe, Sn, Pb, Bi and mixtures thereof.

31. The method as defined in claim 26 wherein said inert rinsing agent comprises an aqueous solution.

32. A process for the preparation of an electrically non-conductive surface capable of retaining thereon a colloidal species to receive a metal coating over a selected area thereof, which comprises:
selectively coating a portion of the surface with a colloidophobic material selected from the group of colloidophobic materials consisting of (1) a composition comprising a dimethoxy polysiloxane having a viscosity ranging from 20 to 100,000 centipoise, (2) a composition comprising a polyfluoroalkyl ester, (3) a composition comprising a perfluoro epoxy resin, and (4) a composition comprising a colloidal silica having chemically bonded to the surface thereof amounts of from about 0.01 to about 30 percent by weight based on the weight of the silica of a disilizane compound having the general formula

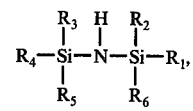

wherein $R_1$, $R_2$, $R_3$, $R_4$, $R_5$ and $R_6$ are like or unlike radicals selected from the group consisting of alkyl having one to five carbon atoms to delineate a relatively colloidophilic area corresponding to the selected area;
depositing on said selectively coated surface a sol comprising a colloidal activating metal species selected from the group consisting of (a¹) a species capable of initially functioning as a reduction catalyst in an electroless metal deposition, and (b¹) a species capable of being reduced to a species capable of functioning as a reduction catalyst in an electroless metal deposition; and rinsing said deposited surface with an inert agent to remove said sol from said coated portion.

33. The method as defined in claim 32 which further comprises:
when said activating metal species comprises (b¹), treating said rinsed surface with a suitable reducing agent to form a catalytic pattern corresponding to the selected area; and
exposing said catalytic pattern to an electroless plating solution to deposit an electroless metal thereon.

34. The method as defined in claim 32 which further comprises when said activating metal species comprises (a¹), exposing said rinsed surface to an electroless plating solution to deposit an electroless metal thereon.

35. The method as defined in claim 32 wherein said colloidophobic material comprises said composition comprising said colloidal silica.

36. The method as defined in claim 32 wherein said polyfluoroalkyl ester is selected from the group consisting of polyperfluoro octyl methacrylate and polyperfluoro lauryl methacrylate.

37. The method as defined in claim 32 wherein said perfluoro epoxy resin is selected from the group consisting of (a) the reaction product of a reaction mixture comprising the diglycidyl ether of 1,3 bis [2-hydroxyhexafluoro-2-propyl]-5-heptafluoro-propyl benzene and 1,4 bis (aminomethyl) cyclohexane and (b) the reaction product of a reaction mixture comprising the diglycidyl ether of 1,3 bis [2-hydroxyhexafluoro-2-propyl]-5-penta decafluoro-heptyl benzene, 1,4 bis (aminomethyl) cyclohexane and perfluorotetradecane.

38. The method as defined in claim 32 wherein said inert agent comprises an aqueous solution.

39. A method of selectively rendering a hydrophobic surface hydrophilic, said surface being capable of retaining thereon a colloidal species, which comprises:
(a) selectively coating a portion of the surface with a colloidophobic material, selected from the group of colloidophobic materials consisting of (1) a composition comprising a dimethoxy polysiloxane having a viscosity ranging from 20 to 100,000 centipoise, (2) a composition comprising a polyfluoroalkyl ester, (3) a composition comprising a perfluoro epoxy resin, and (4) a composition comprising a colloidal silica having chemically bonded to the surface thereof amounts of from about 0.01 to about 30 percent by weight based on the weight of the silica of a disilizane compound having the general formula

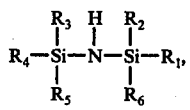

wherein $R_1$, $R_2$, $R_3$, $R_4$, $R_5$ and $R_6$ are like or unlike radicals selected from the group consisting of alkyl having one to five carbon atoms, to render said portion colloidophobic and to delineate an exposed surface pattern capable of retaining a colloidal species thereon; and
(b) treating said selectively coated surface with a stable aqueous sol comprising colloidal particles of a hydrous oxide of an element selected from the group consisting of Be, Mg, Ti, Zr, V, Cr, Mo, W, Mn, Fe, Co, Ni, Pd, Pt, Cu, Ag, Au, Zn, Cd, Hg, Al, In, Tl, Si, Ge, Sn, Pb, Bi, La, Ce, Th, U and mixtures thereof to deposit said colloidal particles on said exposed surface pattern to render said pattern hydrophilic.

40. The method as defined in claim 39 which further comprises treating said sol treated surface with an inert rinsing agent to remove excess portions of said sol from said sol treated surface.

41. The method as defined in claim 40 wherein said inert reagent comprises an aqueous solution.

42. The method as defined in claim 39 wherein said colloidophobic material comprises said composition comprising said colloidal silica.

43. The method as defined in claim 39 wherein said polyfluoroalkyl ester is selected from the group consisting of polyperfluoro octyl methacrylate and polyperfluoro lauryl methacrylate.

44. The method as defined in claim 39 wherein said perfluoro epoxy resin is selected from the group consisting of (a) the reaction product of a reaction mixture comprising the diglycidyl ether of 1,3 bis [2-hydroxyhexafluoro-2-propyl]-5-heptafluoro-propyl benzene and 1,4 bis (aminomethyl) cyclohexane and (b) the reaction product of a reaction mixture comprising the diglycidyl ether of 1,3 bis [2-hydroxyhexafluoro-2-propyl]-5-penta decafluoro-heptyl benzene, 1,4 bis (aminomethyl) cyclohexane and perfluorotetradecane.

45. A method of depositing a metal on a surface, capable of retaining thereon a colloidal species, which comprises:
(a) selectively coating a portion of the surface with a colloidophobic material selected from the group consisting of (1) a composition comprising a dimethoxy polysiloxane having a viscosity ranging from 20 to 100,000 centipoises, (2) a composition comprising a polyfluoroalkyl ester, (3) a composition comprising a perfluoro epoxy resin, and (4) a composition comprising a colloidal silica having chemically bonded to the surface thereof amounts of from about 0.01 to about 30 percent by weight based on the weight of silica of a disilizane compound having the general formula

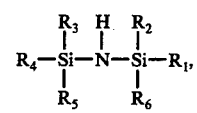

wherein $R_1$, $R_2$, $R_3$, $R_4$, $R_5$ and $R_6$ are like or unlike radicals selected from the group consisting of alkyl having having one to five carbon atoms, to render said portion colloidophobic and to delineate an exposed surface pattern capable of retaining a colloidal species thereon;
(b) treating said selectively coated surface with a sol comprising a colloidal species selected from the group consisting of (a¹) a colloidal species capable of reducing an activating metal ion to an activating metal, and (b¹) a colloidal activating metal species capable of participating in an electroless metal deposition to deposit said colloidal species on said exposed surface pattern; and
(c) treating said sol treated surface with an inert rinsing agent to remove excess portions of said sol from said sol treated surface to form retained, deposited colloidal species on said pattern.

* * * * *